(12) United States Patent
Richter et al.

(10) Patent No.: US 11,728,321 B2
(45) Date of Patent: Aug. 15, 2023

(54) OPTOELECTRONIC COMPONENT AND MANUFACTURING METHOD

(71) Applicant: OSRAM OLED GmbH, Regensburg (DE)

(72) Inventors: Daniel Richter, Bad Abbach (DE); Tobias Gebuhr, Regensburg (DE); Michael Betz, Regensburg (DE); Markus Boss, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/969,153

(22) PCT Filed: Feb. 25, 2019

(86) PCT No.: PCT/EP2019/054521
§ 371 (c)(1),
(2) Date: Aug. 11, 2020

(87) PCT Pub. No.: WO2019/166352
PCT Pub. Date: Sep. 6, 2019

(65) Prior Publication Data
US 2021/0043615 A1    Feb. 11, 2021

(30) Foreign Application Priority Data
Feb. 27, 2018 (DE) .......................... 102018104382.1

(51) Int. Cl.
*H01L 25/16* (2023.01)
*H01L 33/00* (2010.01)
(Continued)

(52) U.S. Cl.
CPC .......... *H01L 25/167* (2013.01); *H01L 33/005* (2013.01); *H01L 33/486* (2013.01);
(Continued)

(58) Field of Classification Search
CPC ..... H01L 25/167; H01L 33/486; H01L 33/58; H01L 33/005; H01L 33/54; H01L 33/62
See application file for complete search history.

(56) References Cited

U.S. PATENT DOCUMENTS 7,300,326 B2   11/2007   Tanaka et al.
8,610,255 B2   12/2013   Won et al.
(Continued)

FOREIGN PATENT DOCUMENTS

DE   102005053217 A1   6/2006
DE   202007007341 U1   7/2007
(Continued)

*Primary Examiner* — Michelle Mandala
*Assistant Examiner* — Jordan M Klein
(74) *Attorney, Agent, or Firm* — Slater Matsil, LLP (57) ABSTRACT

An optoelectronic component and a manufacturing method are disclosed. In an embodiment an optoelectronic component includes an optoelectronic semiconductor chip, a housing having a top side and two protrusions on the top side projecting beyond the top side and a transparent structure, wherein the optoelectronic semiconductor chip is arranged between the protrusions, and wherein the transparent structure is at least partially arranged on the top side of the housing between the protrusions and partially above the optoelectronic semiconductor chip.

4 Claims, 6 Drawing Sheets

(51) Int. Cl.
*H01L 33/48* (2010.01)
*H01L 33/54* (2010.01)
*H01L 33/58* (2010.01)
*H01L 33/62* (2010.01)

(52) U.S. Cl.
CPC .............. *H01L 33/54* (2013.01); *H01L 33/58* (2013.01); *H01L 33/62* (2013.01); *H01L 2933/005* (2013.01)

(56) References Cited

U.S. PATENT DOCUMENTS

| | | |
|---|---|---|
| 2008/0061458 A1 | 3/2008 | Park et al. |
| 2010/0193815 A1* | 8/2010 | Jaeger ................. B29C 33/0038 257/E33.056 |
| 2013/0095583 A1 | 4/2013 | Chang |
| 2013/0334556 A1* | 12/2013 | Park ...................... H01L 33/486 257/98 |
| 2014/0124812 A1* | 5/2014 | Kuramoto ............... H01L 24/97 438/27 |
| 2016/0005931 A1* | 1/2016 | Lee ........................ H01L 33/486 257/98 |
| 2016/0240747 A1 | 8/2016 | Pindl et al. |
| 2019/0355882 A1 | 11/2019 | Brandl et al. |

FOREIGN PATENT DOCUMENTS

| | | |
|---|---|---|
| DE | 202008018130 U1 | 12/2011 |
| DE | 102012109144 A1 | 4/2014 |
| DE | 102017101267 A1 | 7/2018 |
| EP | 1156535 A1 | 11/2001 |
| JP | 2981370 B2 | 11/1999 |
| JP | 2011135103 A | 7/2011 |
| WO | 2015055670 A1 | 4/2015 |

* cited by examiner

OPTOELECTRONIC COMPONENT AND MANUFACTURING METHOD

This patent application is a national phase filing under section 371 of PCT/EP2019/054521, filed Feb. 25, 2019, which claims the priority of German patent application 102018104382.1, filed Feb. 27, 2018, each of which is incorporated herein by reference in its entirety.

TECHNICAL FIELD

The invention relates to an optoelectronic component and a method of manufacturing an optoelectronic component.

BACKGROUND

Optoelectronic components generally consist of a housing, an optoelectronic semiconductor chip mounted on or in the housing, and may have a transparent structure, for example a lens structure. The transparent structure may serve to protect the optoelectronic semiconductor chip and, if the transparent structure is embodied as a lens structure, may additionally enable beam shaping of the light emerging from the optoelectronic component or entering the optoelectronic component.

Transparent structures for such optoelectronic components are first produced in the state of the art in an external process and then individually glued onto the housing. Alternatively, the transparent structures may be produced directly on a surface of the housing by means of dispensing, wherein the realizable form of the transparent structure is determined by the surface tension of the material used. Producing the transparent structures directly on the surface of the housing by means of compression molding is difficult to realize, because the transparent structure has to be guided over the whole housing, which causes stress around the component. In this case, the transparent structure may become detached from the housing.

SUMMARY

Embodiments provide an improved manufacturing process for an optoelectronic component having a transparent structure and an improved optoelectronic component having a transparent structure.

An optoelectronic component includes an optoelectronic semiconductor chip, a housing and a transparent structure. The optoelectronic semiconductor chip may be embodied as a light-emitting diode, a laser diode or a photodiode. The housing of the optoelectronic component has a top side, wherein the housing also has two protrusions on the top side that protrude over the top side. The transparent structure is at least partially arranged between the protrusions on the top side of the housing.

The protrusions that extend beyond the top side of the housing may thus be used to delimit the transparent structure. This provides a simple manufacturing process of the optoelectronic component.

The protrusions and the housing may be made of the same material in one piece or from different materials.

In an embodiment, the transparent structure is planar with the protrusions in areas adjacent to the protrusions. This may be achieved by placing a mold for the transparent structure on top of the protrusions, thus creating a cavity within the mold which may be filled with the transparent structure. This is particularly easy to achieve if the mold has a flat surface that may be placed on top of the protrusions. This makes the transparent structure planar with the protrusions in areas adjacent to the protrusions and allows simple manufacturing of the optoelectronic component.

In an embodiment, the transparent structure includes a lens structure. In this context, the transparent structure may be embodied entirely as a lens structure or it may also comprise partial areas that are not embodied as a lens structure. Such a component with a transparent structure embodied as a lens structure is easy to manufacture.

In an embodiment, a rotational symmetry axis of the lens structure is arranged above a center of the optoelectronic semiconductor chip. This provides for particularly advantageous beam geometries.

In an embodiment, the housing comprises a cavity. The cavity is arranged between the protrusions and the optoelectronic semiconductor chip is placed in the cavity of the housing. Such an arrangement of the optoelectronic semiconductor chip within the cavity results in the optoelectronic semiconductor chip being protected by the housing. The cavity may be guided into the housing from the top side of the housing.

In an embodiment, the cavity is partially filled with the transparent structure. This ensures that the transparent structure parallel to the top side of the housing cannot simply slip and remains at the specified position. This provides a more stable optoelectronic component.

In an embodiment, a conversion layer is arranged between the transparent structure and the optoelectronic semiconductor chip. The conversion layer may thereby be embodied as a small plate which is positioned on the optoelectronic semiconductor chip. Alternatively, the conversion layer may also be embodied as a sealing layer above the optoelectronic semiconductor chip, particularly if the optoelectronic semiconductor chip is arranged in a cavity of the housing. Furthermore, the conversion layer may be produced by spray coating. The conversion layer may fill the cavity completely or partially, wherein if the cavity is partially filled by the conversion layer, the remaining volume within the cavity may be filled by the transparent layer and thus the stability of the optoelectronic component may be increased.

In an embodiment, the transparent structure is guided up to an edge of the optoelectronic component at two sides of the housing. This simplifies a manufacturing process as a plurality of optoelectronic components comprising a plurality of transparent structures may be manufactured adjacent to each other in one operational step and then separated.

A method of manufacturing an optoelectronic component includes the following steps: producing a housing having a top side and two protrusions protruding over the top side, inserting an optoelectronic semiconductor chip into the housing and applying a transparent structure to the top side of the housing, the transparent structure being at least partially arranged between the protrusions.

By applying the transparent structure directly to the top side of the housing without creating the transparent structure separately from the housing, the manufacturing process for the optoelectronic component is significantly simplified.

In an embodiment, the housing is produced from a plastic material. This may particularly be carried out by means of injection molding. Plastic housings are well suited for optoelectronic components. Producing these by means of injection molding allows for a simple and cost-effective production of the housing. The protrusions of the housing may be produced within the same injection-molding process step.

In an embodiment of the method, the housing comprising the optoelectronic semiconductor chip is inserted into a transfer-molding tool. The transparent structure comprises a plastic and/or an epoxy resin and/or a silicon. The transparent structure is produced by means of a transfer-molding process inside of the transfer-molding tool. The transfer-molding tool may determine the later form of the transparent structure and may e.g., be embodied in such a way that the transparent structure later comprises a lens structure.

In an embodiment of the method, the housing with the optoelectronic semiconductor chip is inserted into a transfer-molding tool in such a way that the transfer-molding tool rests on the protrusions and the housing with the protrusions and the injection tool form a region that is sealed for the transparent material, into which the transparent material is transfer-molded. The transparent material then forms the transparent structure. In particular, the sealed area should be designed in such a way that the transparent material cannot penetrate between the transfer-molding tool and the protrusions. There may be an inlet area and an outlet area within the sealed area, wherein the transfer-molded material enters the sealed area through the inlet area and the air within the sealed area may escape from the sealed area through the outlet area. In order to create a complete filling of the sealed area with the transparent material, transparent material may be provided to leave the sealed area through the outlet area.

In an embodiment, the protrusions are deformed when the housing is inserted into the transfer-molding tool. This may further improve the seal between the transfer-molding tool and the housing.

In an embodiment, the transfer-molding tool is embodied in such a way that a lens structure of the transparent material is created.

In an embodiment, a plurality of housings is produced adjacent to one another in an intermediate product. The protrusions of the housings are carried out continuously across the intermediate product. The transparent material is at least partially applied between the continuous protrusions and the intermediate product is then separated into individual optoelectronic components.

If this method is carried out by means of an transfer-molding tool, the transfer-molding tool and the protrusions may be arranged to create a sealed area across the intermediate product and the outlet area of one component is an inlet area of a next component. The transparent material is introduced on one side of the intermediate product and distributed along the protrusions across the intermediate product and thus across the individual housings. This provides a process in which several optoelectronic components may be produced cost-effectively in just a few process steps. In this case, the transparent material that forms the transparent structure is guided along two sides of the housing to one edge of the optoelectronic component.

The separation of the components may be carried out by sawing, etching or laser cutting.

In an embodiment of the method, the housing or the intermediate product has a ramp. The ramp has ramp protrusions, wherein the ramp protrusions merge with the protrusions of the housing at a boundary between the ramp and the top side. The transparent material is additionally applied between the ramp protrusions. Such a ramp may be used to guide the transparent material introduced during transfer molding to the top of the intermediate-product housings. The ramp protrusions, which merge into the protrusions of the housings, may be used to create a seal between the intermediate product and a transfer-molding tool.

BRIEF DESCRIPTION OF THE DRAWINGS

The properties, features and advantages of the invention described above and the way in which they are achieved will become clearer from the following description of embodiment examples, which are explained in more detail in conjunction with the drawings. In the drawings.

DETAILED DESCRIPTION OF ILLUSTRATIVE EMBODIMENTS

Figure 1:
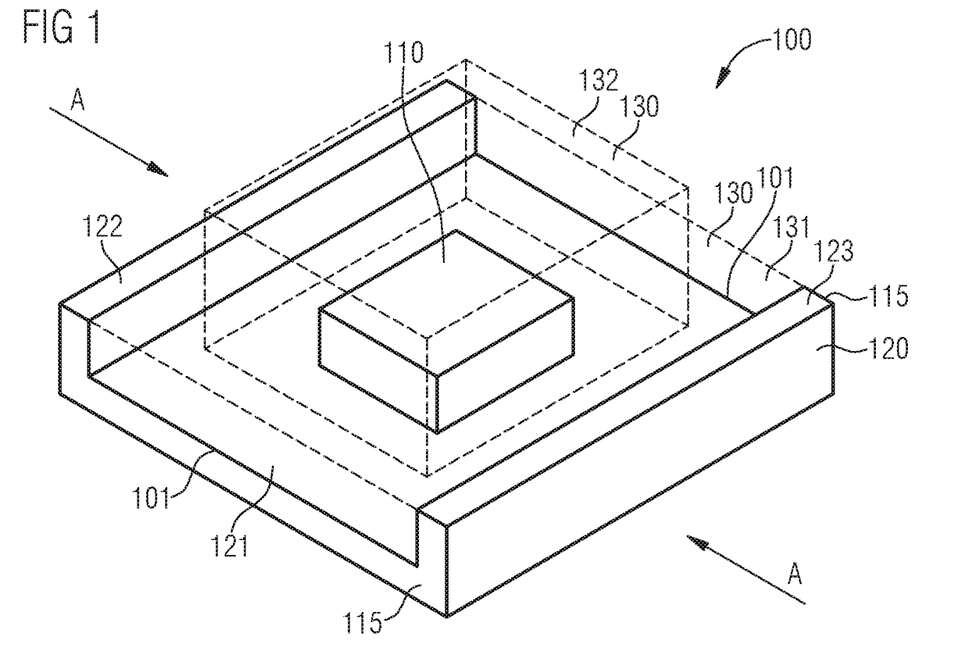
FIG. 1 shows an isometric view through a first embodiment example of an optoelectronic component.

FIG. 1 shows an isometric view of a first embodiment example of an optoelectronic component 100 comprising an optoelectronic semiconductor chip 110, a housing 120 and a transparent structure 130. The housing 120 has a top side 121, the optoelectronic semiconductor chip 110 being located on the top side 121 of the housing 120. The housing 120 furthermore comprises two protrusions 122, 123 on the top side 121, which extend beyond the top side 121, i.e., a first protrusion 122 and a second protrusion 123. The dashed lines show the transparent structure 130. The dashed lines are intended to demonstrate the transparency of the transparent structure 130, so that the features of the optoelectronic component 100 within the transparent structure 130 are visible.

The transparent structure 130 comprises a first area 131 and a second area 132. The first area 131 is adjacent to the top side 121 of the housing 120 and is arranged between the protrusions 122, 123. The second area 132 is arranged above the light-emitting semiconductor chip 110 and not located between the protrusions 122, 123. The transparent structure 130 is guided up to an edge 101 of the optoelectronic component 100 at two sides 115 of the housing.

Figure 2:
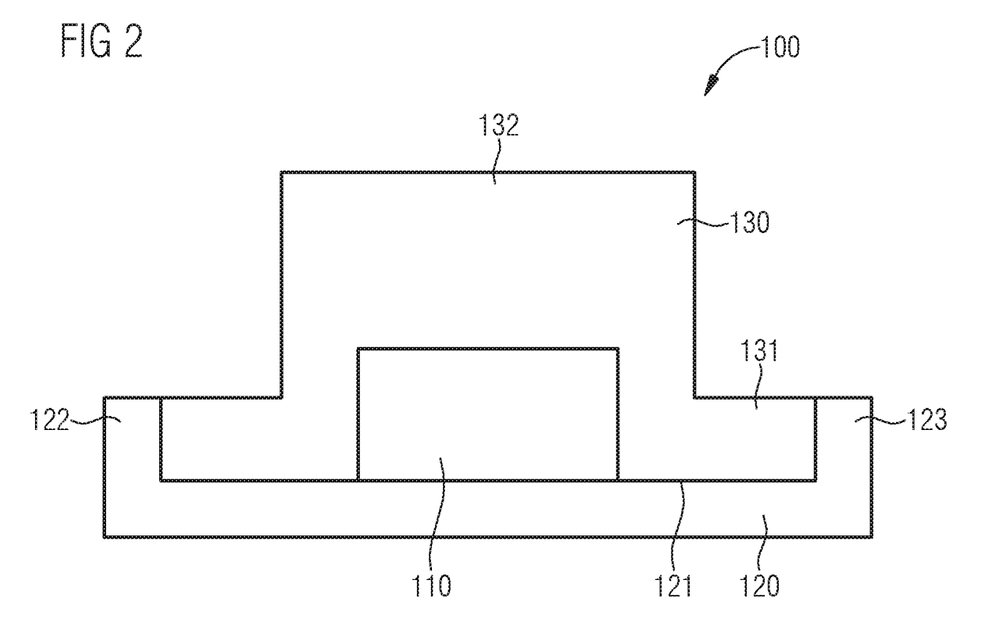
FIG. 2 shows a cross-section through the first embodiment example of the optoelectronic component.

FIG. 2 shows a cross-section through the plane of the optoelectronic component 100 of FIG. 1, marked with the letter A.

The optoelectronic semiconductor chip 110 is arranged between the protrusions 122, 123 and projects over the protrusions 122, 123. Above the optoelectronic semiconductor chip 110, the second area 132 of the transparent structure 130 is arranged.

Adjacent to the protrusions 122, 123, the transparent structure 130 is planar with the protrusions 122, 123. In particular, the first area 131 of the transparent structure 130 is planar with the protrusions 122, 123.

As an alternative to the depictions of FIGS. 1 and 2, it may be provided that a design height of the light-emitting semiconductor chip 110 is less than a height of the protrusions 122, 123. In this case, the second area 132 of the transparent structure 130 may be omitted. The light-emitting semiconductor chip 110 is then completely covered by the transparent structure 130, and particularly by the first area 131 of the transparent structure 130.

Figure 3:
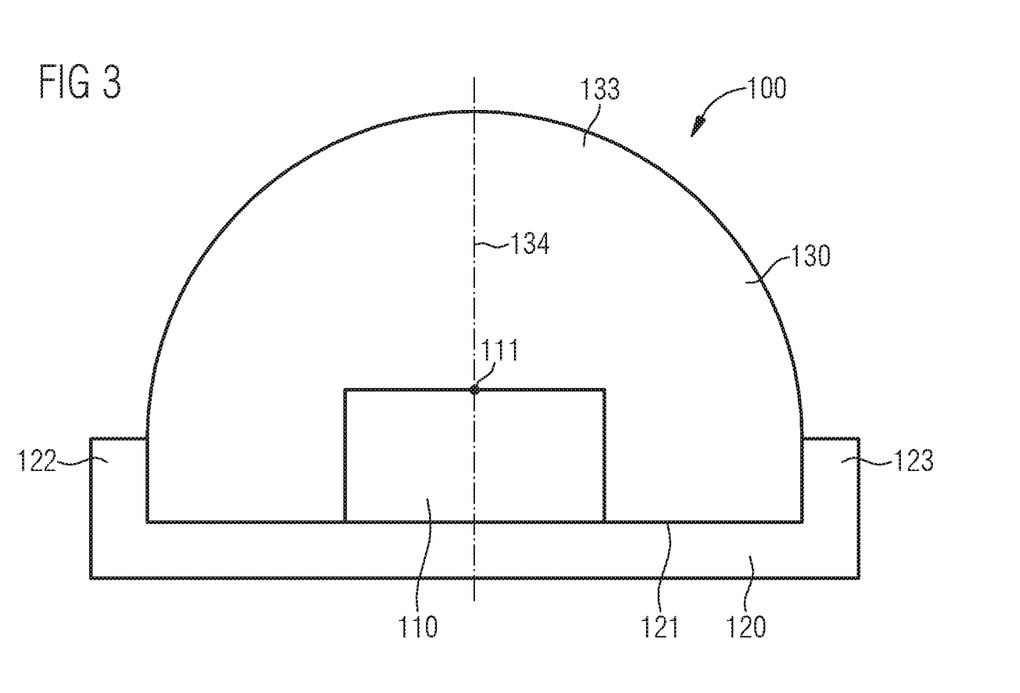
FIG. 3 shows a cross-section of a second embodiment example of an optoelectronic component.

FIG. 3 shows a cross-section of a second embodiment example of an optoelectronic component 100. In contrast to the embodiment first example of FIGS. 1 and 2, the transparent structure 130 is embodied as a lens structure 133. The lens structure 133 extends to the protrusions 122, 123 and completely covers the optoelectronic semiconductor chip 110. The lens structure 133 is embodied as a convex lens. In this embodiment example, the transparent structure 130 is not planar with the protrusions 122, 123 in the areas adjacent to the protrusions 122, 123. The lens structure 133 may only be formed above the optoelectronic semiconductor chip 110, analogously to the second area 132 of the transparent structure 130 of the first embodiment example in FIG. 1. In this case, the transparent structure 130 may, in analogy to the first embodiment example, have a first area 131 which is planar with the protrusions 122, 123.

In an embodiment example, a rotational symmetry axis 134 of the lens structure 133 is arranged above a center iii of the optoelectronic semiconductor chip 110. However, the rotational symmetry axis 134 may also be arranged outside of the center iii of the optoelectronic semiconductor chip 110 and in particular it may not run through the center 111. Alternatively, the lens structure 133 may be designed as a cylindrical lens.

Figure 4:
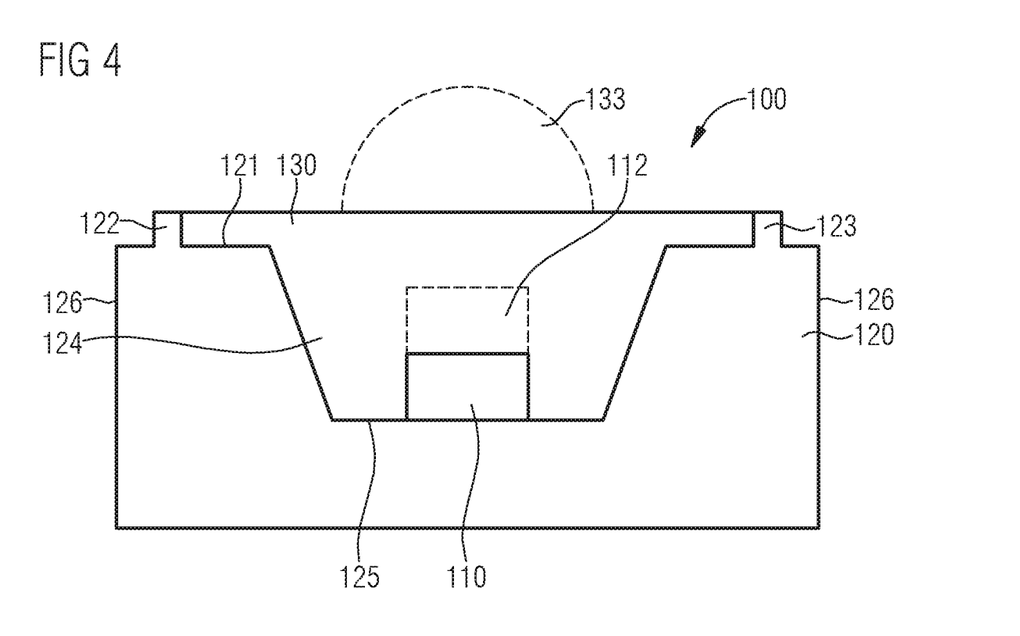
FIG. 4 shows a cross section through a third embodiment example of an optoelectronic component.

FIG. 4 shows a cross-section of a third embodiment example of an optoelectronic component 100. The housing 120 of the optoelectronic component 100 has a cavity 124 originating at the top side 121, with the cavity 124 having a mounting surface 125 in parallel to the top side 121. The optoelectronic half-conductor chip 110 is arranged on the mounting surface 125. Starting from the top side 121, protrusions 122, 123 are arranged extending beyond the top side 121. The transparent structure 130 is partially located between the protrusions 122, 123 and fills the spaces of cavity 124 not occupied by the optoelectronic semiconductor chip 110. The transparent structure 130 is thus partially located within cavity 124. Above the optoelectronic semiconductor chip 110, an optional conversion layer 112 is arranged, which is shown as a dashed line and may be embodied as a small plate positioned on the optoelectronic semiconductor chip 110. The dashed line is intended to illustrate that the conversion layer 112 is optional. The conversion layer 112 may be set up to convert light emitted by the optoelectronic semiconductor chip 110 into light of a different wavelength.

Alternatively, the conversion layer 112 may be realized as a spray coating layer. Such a conversion layer 112 realized as a spray coating layer may also cover further areas of the cavity 124.

In addition, the dashed line in FIG. 4 shows an optional lens structure 133 above the optoelectronic semiconductor chip 110, which is embodied as a converging lens analogous to FIG. 3. Here, too, the dashed line shows that the lens structure 133 is optional.

In the third embodiment example, the protrusions 122, 123 are not located on the side faces 126 of the housing 120, but are set off from the side faces 126.

Figure 5:
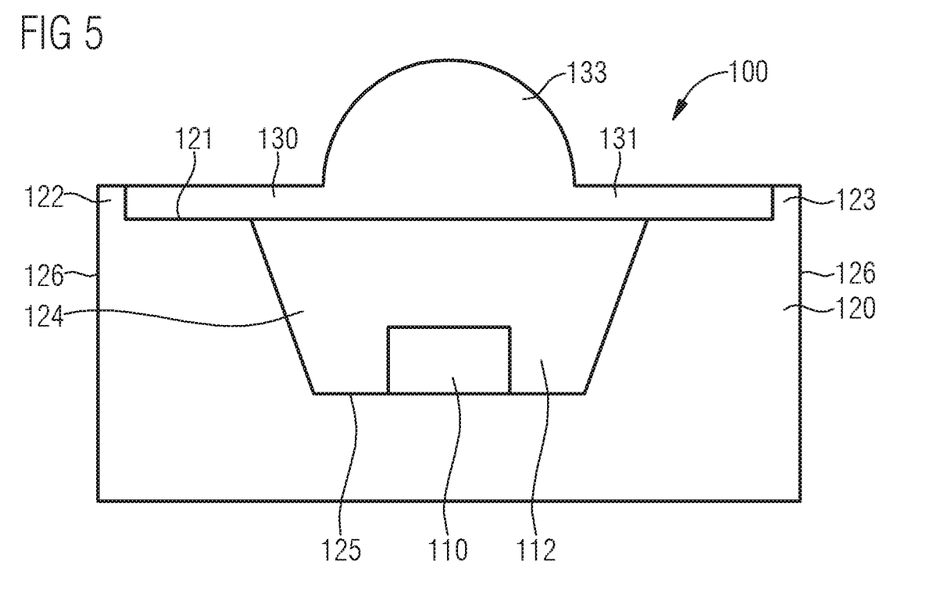
FIG. 5 shows a cross section through a fourth embodiment example of an optoelectronic component.

FIG. 5 shows a cross-section through a fourth embodiment example of an optoelectronic component 100 which corresponds to the optoelectronic component 100 of FIG. 4, unless differences are described in the following. The lens structure 133 optionally shown in FIG. 4 is fully formed in the optoelectronic component 100 of FIG. 5. Furthermore, the conversion layer 112 optionally shown in FIG. 4 is not embodied as a small plate but as a filling of the cavity 124. The cavity 124 is filled with conversion layer 122 up to the top side 121 of the housing 120. The protrusions 122, 123 are located on the side surfaces 126 of the housing 120. The transparent structure 130 has a first area 131 between the protrusions 122 and 123 and the lens structure 133, wherein the lens structure 133 is not arranged between the protrusions 122, 123.

The embodiment of the transparent structure 130 of the fourth embodiment example may also be used in the third embodiment example of FIG. 3.

Figure 6:
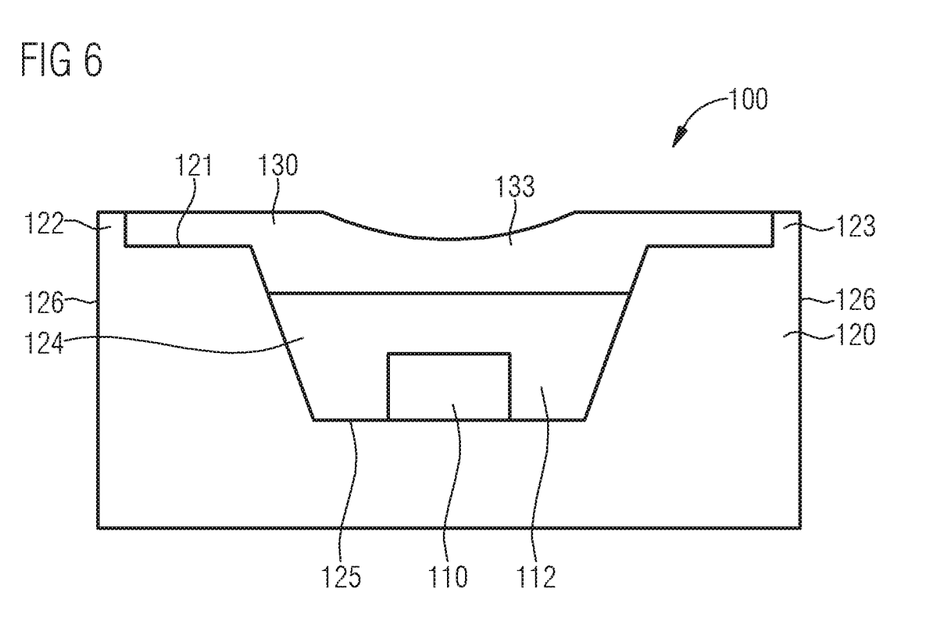
FIG. 6 shows a cross section through a fifth embodiment example of an optoelectronic component.

FIG. 6 shows a cross-section through a fifth embodiment example of an optoelectronic component 100, which corresponds to the optoelectronic component 100 in FIG. 5, unless differences are described in the following. The conversion layer 112 does not fill the cavity 124 up to the top side 121, which means that the conversion layer 112 only partially fills the cavity 124.

The transparent structure 130 is partially located inside of the cavity 124 above the conversion layer 112. The lens structure 133 of the transparent structure 130 is not embodied as a convex lens, but as a concave lens.

The embodiments of FIGS. 4 to 6 may be combined with each other in any way with regard to the arrangement of the protrusions 122, 123, with regard to the embodiment of the conversion layer 112 and with regard to the embodiment of the lens structure 133, so that, for example, the protrusions 122, 123 of FIG. 4, the embodiment of the conversion layer 112 of FIG. 5 and the embodiment of the lens structure 133 of FIG. 6 may be realized in a further embodiment example. Furthermore, in all three embodiments it may be provided to form the lens structure 133 in analogy to FIG. 3.

Figure 7:
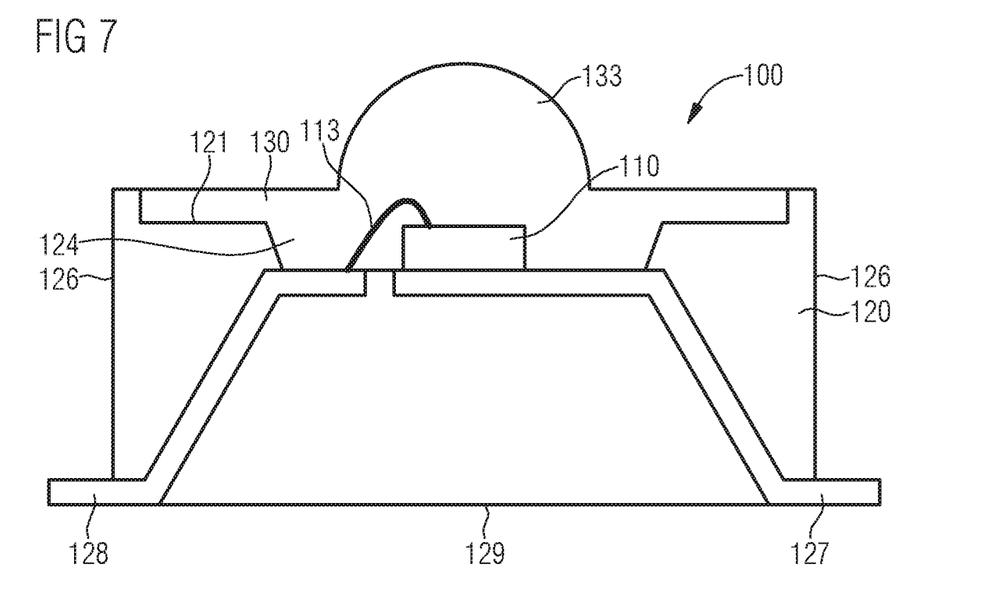
FIG. 7 shows a cross-section of a sixth embodiment example of an optoelectronic component.

FIG. 7 shows a cross-section through a sixth embodiment example of an optoelectronic component 100, which corresponds to the optoelectronic component 100 of FIG. 5, unless differences are described in the following. In the sixth embodiment example of FIG. 7, no conversion layer 112 is provided. However, one of the previously described conversion layers 112 may be provided as an alternative. The optoelectronic semiconductor chip 110 is thus directly embedded in the transparent structure 130 within the cavity 124. Two deep-drawn leadframe sections 127, 128 are provided inside of the housing 120. A first leadframe section 127 is arranged inside of the housing 120 in such a way that the optoelectronic semiconductor chip 110 is arranged on the first leadframe section 127 and thus establishes an electrical contact. A second leadframe section 128 is connected to a top side of the light-emitting semiconductor chip 110 by means of a bonding wire 113. The leadframe sections 127, 128 are led to a bottom side 129 of the housing 120 and protrude over the side surfaces 126 of the housing 120.

As an alternative to the deep-drawn leadframe sections 127, 128, conventional leadframe sections or vias or other electrical contact possibilities may be provided.

In order to produce an optoelectronic component of the embodiment examples shown, a housing 120 with a top side 121 and two protrusions 122, 123 projecting over the top side 121 are first produced. Subsequently, an optoelectronic semiconductor chip 110 is inserted into the housing 120. A transparent structure 130 is then applied to the top side 121 of the housing 120, with the transparent structure 130 being at least partially arranged between the protrusions 122, 123.

In an embodiment example of the method, the housing 120 is produced from a plastic material, in particular by means of an injection-molding process. It may be provided to arrange leadframe sections 127, 128 within the housing 120, as shown in FIG. 7. Alternatively, other contacting elements may be integrated into the housing 120 during injection molding of the housing 120.

Figure 8:
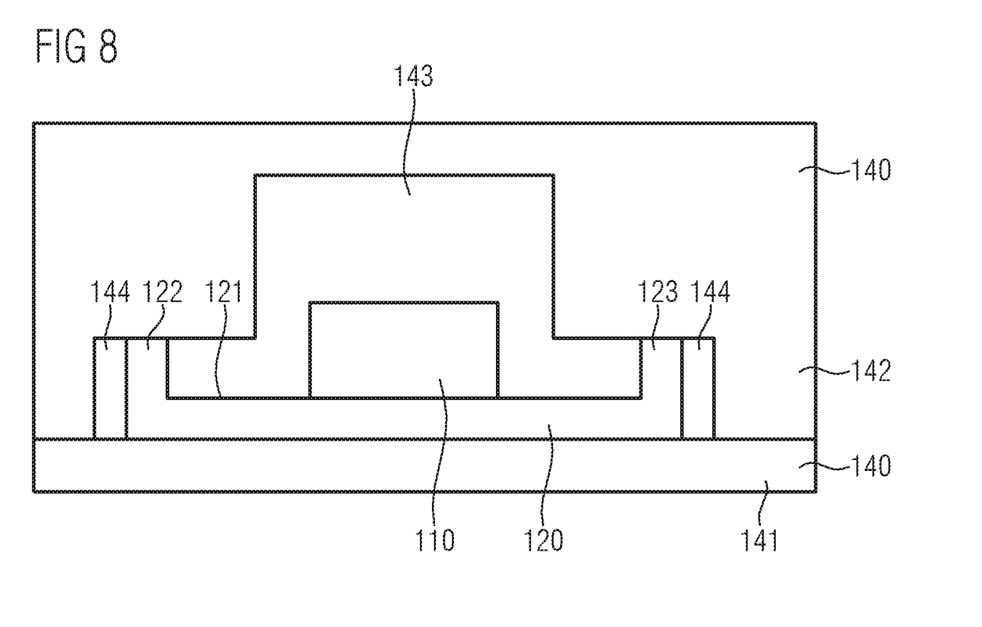
FIG. 8 shows a cross section through a housing of an opto-electronic component inserted into a transfer-molding tool during a manufacturing process.

In an embodiment example of the method, the housing 120 with the optoelectronic semiconductor chip 110 is inserted into a transfer-molding tool 140. A cross-section of such a transfer-molding tool 140 with inserted housing 120 and optoelectronic semiconductor chip 110 is shown in FIG. 8. The transfer-molding tool 140 consists of a lower plate 141 and an upper part 142. The housing 120 is arranged on the lower plate 141. The upper part 142 is arranged above the housing 120 in such a way that the upper part 142 rests on the protrusions 122, 123. A recess 143 within the upper part 142 is embodied in such a way that within the recess 143 the second area 132 of the transparent structure 130 of the first embodiment example of FIGS. 1 and 2 may be created when a transparent material is pressed into the recess 143. Alternatively, the recess 143 may also be configured to form a lens structure 133 as shown in FIGS. 3 to 5. Alternatively, instead of the recess 143, an elevation may also be provided by means of which a lens structure 133 may be formed as shown in FIG. 6. The transparent structure 133 may have a plastic and/or an epoxy resin and/or a silicone. As an alternative to the transfer-molding process, the process for producing the transparent structure 130 may also be embodied as an injection-molding process.

It may be provided that the housing 120 is arranged on a substrate and the substrate is inserted into the transfer-molding tool 140 together with the housing. In this case the upper part 142 may also be embodied in such a way that the upper part 142 rests on the substrate and the substrate rests on the lower plate 141.

In an embodiment example of the method, the housing 120 with the optoelectronic semiconductor chip 110 is inserted into the transfer-molding tool 140 in such a way that the transfer-molding tool 140 and in particular the upper part 142 of the transfer-molding tool 140 rests on the protrusions 122, 123 in such a way that the housing 120 having the protrusions 122, 123 and the upper part 142 form an area which is sealed for the transparent material. This means that while transparent material is pressed into the transfer-molding tool 140, the transparent material cannot penetrate through an area between the protrusions 122, 123 and into cavities 144 of the transfer-molding tool, since a tight seal between the protrusions 122, 123 and the transfer-molding tool 140 is achieved.

In an embodiment example, the transfer-molding tool 140 is embodied in such a way that when the transfer-molding tool 140, 141, 142 is closed, the protrusions 122, 123 are deformed. This may particularly be embodied in such a way that the protrusions 122, 123 are compressed by up to fifteen percent, in particular by five to ten percent of their height.

FIG. 8 shows a cross-section through a housing 120 with an optoelectronic semiconductor chip 110. However, further housings with further optoelectronic semiconductor chips 110 may be arranged in or out of the drawing plane so that transparent structures of several optoelectronic components 100 may be produced in one step during the transfer-molding process. This may in particular be achieved by producing the housings 120 adjacent to one another in an intermediate product and then producing a continuously transparent structure. The individual components may then be separated from each other by a saw cut, an etching process and/or a laser cutting process. In this case, after separation, the feature described in FIG. 1 is obtained that the transparent structure 130 is guided up to the edge 101 of the optoelectronic component 100 at two sides of the housing 115.

Similarly, transparent structures of a plurality of optoelectronic components 100 may be created in one method step if the transparent structures are not created by transfer molding, for example in an injection-molding process.

Figure 9:
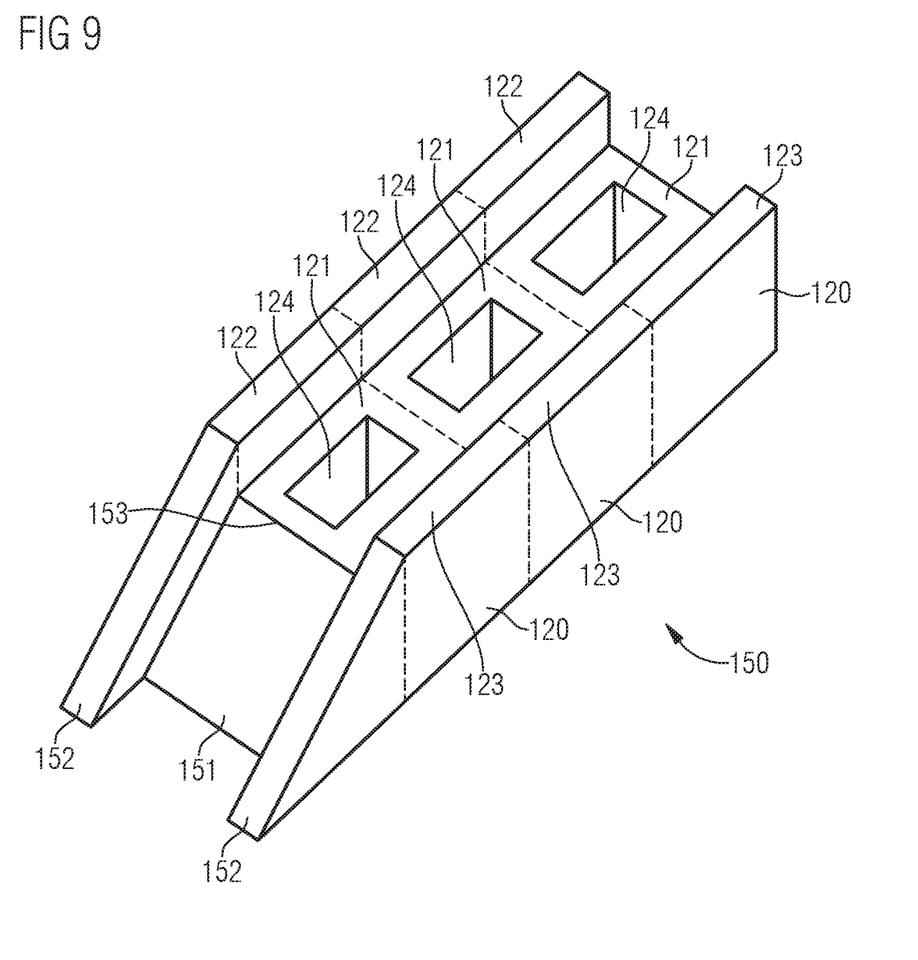
FIG. 9 shows an intermediate product during the manufacture of an optoelectronic component.

FIG. 9 shows such an intermediate product 150 consisting of three housings 120, each of which has a first protrusion 122 and a second protrusion 123, wherein the protrusions 122, 123 are formed continuously across all three housings 120. Dashed lines indicate the positions at which the housings 120 may later be separated. Starting from its top side 121, each housing 120 has a cavity 124 into which an optoelectronic semiconductor chip 110 may be inserted.

In addition, the intermediate product 150 of FIG. 9 has an optional ramp 151 having ramp protrusions 152. The ramp protrusions 152 merge into protrusions 122, 123 at a boundary 153 between the ramp 151 and the top side 121. If the intermediate product 150 of FIG. 9 is inserted into a transfer-molding tool 140 of FIG. 8, this allows for a simpler production of optoelectronic components 100. Transfer-molding tools 140 generally have an inlet for the material to be transfer-molded at the level of the lower plate 141. Alternatively, the inlet may be formed in the upper part 142. This is particularly advantageous if a substrate is arranged between the lower plate 141 and the upper part 142. This entrance may be located in the area of the ramp 151 so that the material pressed into the transfer mold 140 may be guided up to the level of the upper plate 121 by means of the ramp 151 and form the transparent structure 130 there. For this purpose, the transfer-molding tool 140, in particular the upper part 142 of the injection-pressing tool 140 may have an upper part ramp parallel to the ramp 151. Optionally, a further ramp may be provided on the side of the intermediate product 150 opposite the ramp 151, by means of which the transparent material or, respectively, the air at locations for the transparent material prior to transfer molding, may be guided back to the level of the lower plate 141.

The ramp protrusions 152, as well as the protrusions 122, 123 may be used as a seal between the intermediate product 150 and the upper part 142 of the transfer-molding tool 140.

Figure 10:
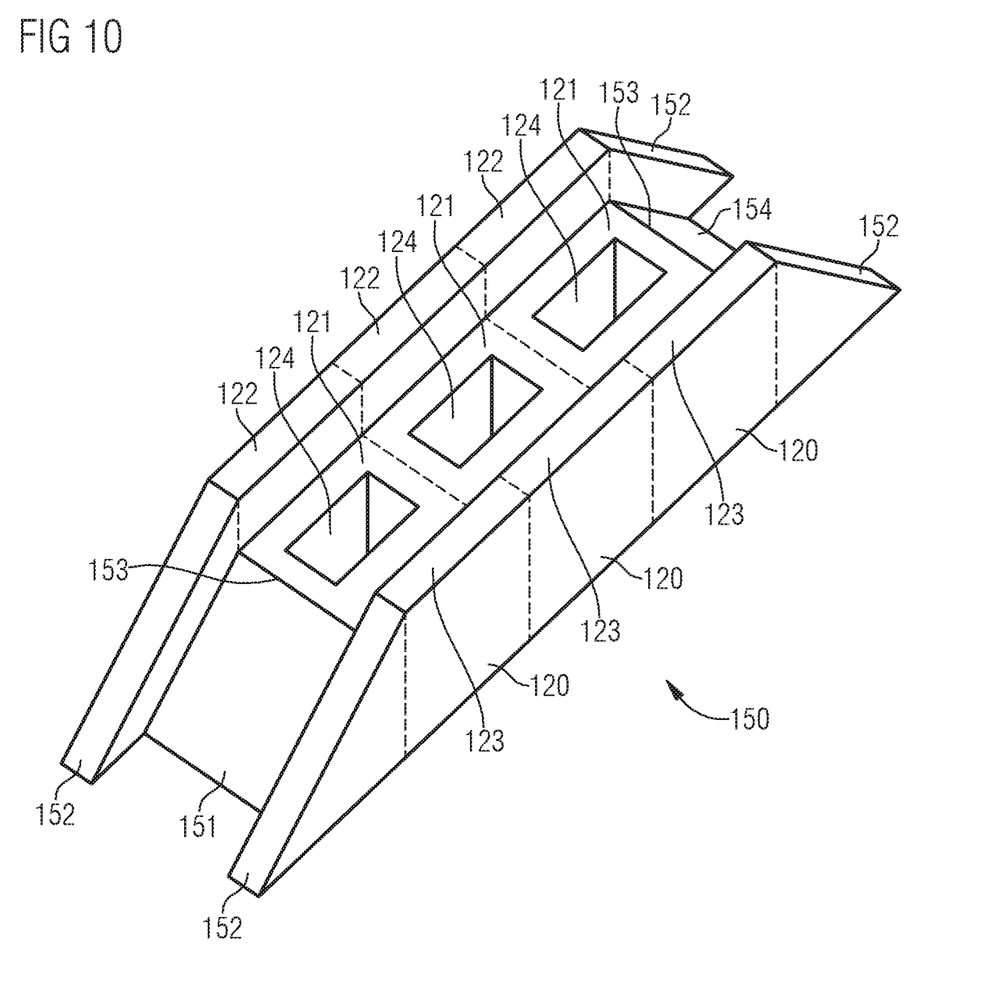
FIG. 10 shows a further intermediate product.

FIG. 10 shows a further intermediate product 150 which corresponds to the intermediate product 150 of FIG. 9, unless differences are described in the following. A further ramp 154 is arranged at the intermediate product 150 opposite to the ramp 151, wherein by means of the further ramp 154 the transparent material or, respectively, the air present at locations provided for the transparent material prior to transfer molding may be guided back to the level of the lower plate 141. The further ramp 154 also comprises ramp protrusions 152. The ramp protrusions 152 of the further ramp 154 merge into the protrusions 122, 123 at a boundary 153 between the further ramp 154 and the top side 121.

A pitch of the ramp 151 or, respectively, the further ramp 154 may be between ten and one hundred percent.

Alternatively to the illustration in FIGS. 9 and 10, a corresponding ramp 151 or further ramp 154 may also be provided for a single housing 120.

The optoelectronic semiconductor chip 110 may be embodied as a light-emitting diode or laser diode and have a conversion layer 112. Similarly, the optoelectronic semiconductor chip 110 may also be embodied as a light-emitting diode or laser diode without conversion layer 112. Furthermore, the optoelectronic semiconductor chip 110 may be a photodiode.

The transparent structure 130 may be designed in such a way that more than 75%, in particular more than 90%, in particular more than 95%, of the light emitted by the optoelectronic semiconductor chip 110 embodied as a light-emitting diode or laser diode passes through the transparent structure 130. Furthermore, the specified transparencies may also apply to light converted by conversion layer 112. The emitted light may be visible light, but also infrared or UV radiation. Moreover, the transparency may also refer to the light detected by the photodiode.

A design height of the housing 120 without the protrusions 122, 123 may be between one hundred micrometers and one thousand seven hundred micrometers. A height of the protrusions 122, 123 may be between thirty and three hundred, in particular between fifty and two hundred and, particularly preferably, between eighty and one hundred and twenty micrometres.

Although the invention has been illustrated and described in detail by the preferred embodiment examples, the invention is not limited by the disclosed examples and other variations may be derived by the skilled person without exceeding the protective scope of the invention.

The invention claimed is:

1. A method for manufacturing an optoelectronic component, the method comprising:

producing a housing having a top side and two protrusions projecting over the top side;

inserting an optoelectronic semiconductor chip into the housing between the protrusions;

inserting the housing with the optoelectronic semiconductor chip into a transfer-molding tool such that the transfer-molding tool rests on the protrusions and the housing with the protrusions and an injection-molding tool thereby forming a region which is sealed for a transparent material; and transfer-molding the transparent material into the region thereby forming a transparent structure, wherein the transparent structure is arranged on the top side of the housing and at least partially between the protrusions.

2. The method according to claim 1, wherein the protrusions are deformed when the housing is inserted into the transfer-molding tool.

3. The method according to claim 1, wherein the housing is produced from a plastic material by an injection-molding process.

4. The method according to claim 1, wherein the transparent structure comprises a plastic and/or an epoxy resin and/or a silicone.

* * * * *